(12) United States Patent
Lee

(10) Patent No.: US 7,663,126 B2
(45) Date of Patent: Feb. 16, 2010

(54) ION IMPLANTATION SYSTEM AND METHOD OF MONITORING IMPLANT ENERGY OF AN ION IMPLANTATION DEVICE

(75) Inventor: Szetsen Steven Lee, Taipei (TW)

(73) Assignee: Chung Yuan Christian University, Taoyuan County (TW)

( * ) Notice: Subject to any disclaimer, the term of this patent is extended or adjusted under 35 U.S.C. 154(b) by 33 days.

(21) Appl. No.: 12/193,319

(22) Filed: Aug. 18, 2008

(65) Prior Publication Data
US 2008/0296484 A1    Dec. 4, 2008

Related U.S. Application Data

(62) Division of application No. 11/137,333, filed on May 26, 2005.

(30) Foreign Application Priority Data
Feb. 23, 2005    (TW) ............................. 94105393 A

(51) Int. Cl.
*H01J 37/317*    (2006.01)
*H01L 21/425*    (2006.01)
*G01D 18/00*    (2006.01)

(52) U.S. Cl. .............................. 250/492.21; 250/252.1; 250/492.2; 250/492.3; 250/281; 315/111.61; 438/514; 118/723 R

(58) Field of Classification Search ............ 250/492.21, 250/252.1, 492.2, 492.3, 281; 315/111.61; 438/514; 118/723 R
See application file for complete search history.

(56) References Cited

U.S. PATENT DOCUMENTS 5,504,341 A * 4/1996 Glavish ................. 250/492.21
2006/0121707 A1 * 6/2006 Lee ............................. 438/514

* cited by examiner

*Primary Examiner*—Nikita Wells
(74) *Attorney, Agent, or Firm*—Muncy, Geissler, Olds & Lowe, PLLC

(57) ABSTRACT

An ion implantation system and method of monitoring implant energy of an ion implantation device. The ion implantation system includes an ion implantation device and a monitoring device. The ion implantation device generates a plurality of charged particles and accelerates them with an accelerating voltage for ion implantation. The monitoring device performs spectroscopic analysis of the charged particles to obtain the real accelerating voltage. Thus, implant energy output by the ion implantation device can be calibrated.

5 Claims, 1 Drawing Sheet

ION IMPLANTATION SYSTEM AND METHOD OF MONITORING IMPLANT ENERGY OF AN ION IMPLANTATION DEVICE

CROSS REFERENCE TO RELATED APPLICATIONS

This application is a Divisional of co-pending application Ser. No. 11/137,333, filed on May 26, 2005, and for which priority is claimed under 35 U.S.C. § 120; and this application claims priority of Application No. 094105393 filed in Taiwan, R.O.C. on Feb. 23, 2005 under 35 U.S.C. § 119; the entire contents of all of which are hereby incorporated by reference.

BACKGROUND OF THE INVENTION

1. Summary of the Invention

The present invention relates to an ion implantation system, and more particularly, to a system of monitoring implant energy of an ion implantation device and method thereof.

2. Brief Discussion of the Related Art

In semiconductor fabrication, dopants are often applied to a semiconductor wafer to control a number of charged carriers and form a conductive area, using doping methods such as liquid deposition, thermal diffusion, or chemical evaporation. Ion implantation is used more widely due to its high precision.

During ion implantation, dopant atoms or molecules are first ionized, such as $P^+$ or $BF_2^+$. Ions are accelerated by an accelerator to acquire a certain kinetic energy and then implanted into a semiconductor wafer. The depth distribution of the implanted ions is obtained by precisely controlling the output energy of the ion implantation device, with the dosage controlled by implantation time and current. Ion implantation provides uniform distribution, purity of dopants, and precise implantation areas with proper masks.

Typically, an ion beam comprises a plurality of ions of the same type and energy in a normal distribution. Output energy of an ion implantation process is typically controlled to 50 to 200 KeV. Depth distribution of the implanted ions in the resulting doped region varies with output energy of the ion implantation device. Due to inaccuracy, the real output energy, equal to the kinetic energy of the ions, is often different from the desired output energy of the ion implantation device. Thus, it is necessary to calibrate the ion implantation device for improved precision.

Ion implantation device calibration is typically performed by destructive procedures, with a test target, such as a silicon wafer, implanted with ions of predetermined output energy. Thereafter, the test target is cut and ion implantation conditions assessed by electron microscope, a complex and time-consuming procedure. Consequently, calibration cannot be performed frequently, and can be only performed for specific output energy levels, further limiting accuracy. Inaccuracy remains at about 200 eV after conventional calibration.

As semiconductor device dimensions decrease and integration increases, required doped regions move closer and closer to the surface of the semiconductor wafer, with ion implantation energy reducing accordingly, as low as 2 KeV. Despite implant energy decreasing significantly, inaccuracy of output energy from implantation device remains about 200 eV, an unacceptable level.

SUMMARY OF THE INVENTION

Embodiments of an ion implantation system comprise an ion implantation device generating a plurality of charged particles and accelerating the charged particles with an accelerating voltage to generate implant energy required ion implantation. The ion implantation system further comprises a monitor system performing spectroscopy analysis to obtain a velocity profile of the charged particles. The monitor system can calibrate the implantation energy of the ion implantation device according to the velocity profile of the charged particles.

Also provided is a method of monitoring implantation energy of an ion implantation device. An ion implantation device is provided, generating at least one charged particle and accelerating the charged particle with an accelerating voltage to generate ion implantation energy necessary for ion implantation. Spectroscopy analysis of the accelerated charged particle obtains a frequency shift. The ion implantation energy of the ion implantation device is then calibrated according to the frequency shift.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION OF THE PREFERRED EMBODIMENTS

Figure 1:
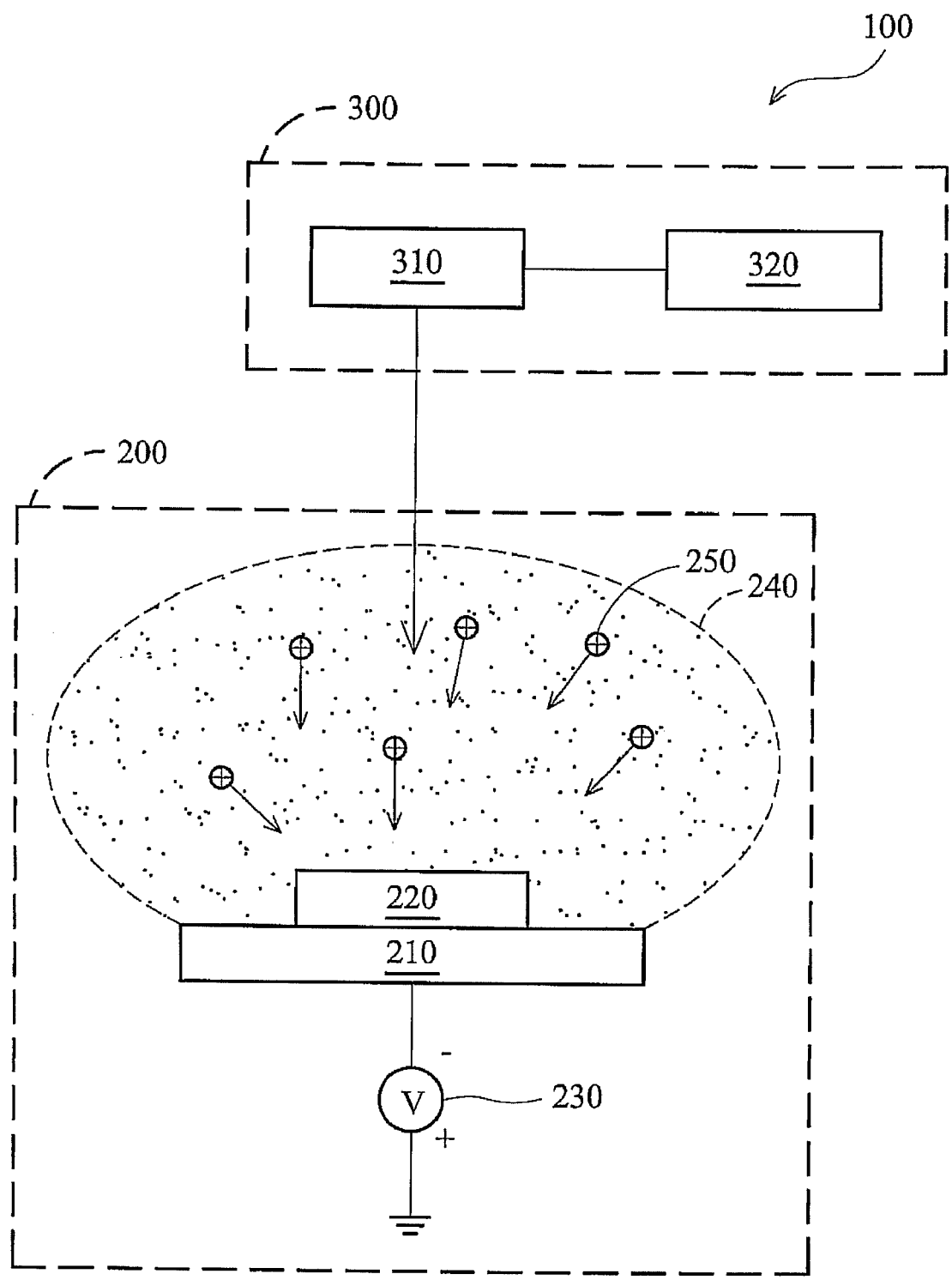
FIG. 1 is a schematic diagram of an embodiment of an ion implantation system of the invention.

FIG. 1 is a schematic diagram of an embodiment of an ion implantation system 100 of the invention. As shown, the ion implantation system 100 comprises an ion implantation device 200 and a monitoring device 300. The ion implantation device 200 generates a plurality of charged particles 250, such as $P^+$ or $BF_2^+$. The ion implantation device also comprises an accelerator to accelerate the charged particles 250 with an accelerating voltage to generate implant energy necessary for ion implantation. In an embodiment of the invention, the semiconductor substrate is mounted on support 210, electrically convected to a direct current (DC) power supply 230. The ion implantation device 200 generates a plasma environment 240 for plasma immersion ion implantation.

The monitor device 300 comprises a spectrometer 310 and a database 320. The spectrometer 310 generates an electromagnetic wave of a known frequency, such as infrared rays, toward the charged particles 250 and detects the frequency after the electromagnetic wave undergoes the Doppler effect, to obtain a frequency shift. The database stores a correct relationship between the frequency shift and the accelerating voltage. Thus, if the frequency shift is obtained, the real accelerating voltage can be calculated by the database 300 and the ion implantation energy of the ion implantation device 200 can be calibrated.

A method of populating database 320 is described in the following. First, in the equation:

$$\frac{\Delta v}{v} = \frac{V_d}{c} = \frac{K\varepsilon}{c} = \frac{KV}{cd}$$

v is a frequency of the electromagnetic wave; Δv is the frequency shift; $V_d$ is the velocity of the charged particle; K is a mobility constant of the charged particle; ε is the electric field; c is the velocity of the electromagnetic wave; V is the accelerating voltage; and d is the acceleration distance. According to the Doppler effect, the ratio between the frequency shift (Δv) and the frequency (v) of the electromagnetic wave equals the ratio between the velocity of the charged particle 250 and that of the electromagnetic wave (c). The velocity of the charged particle equals the mobility constant (K) times the electric field (ε), which is the same as the ratio between the accelerating voltage (V) and the acceleration distance (d). For example, if $H_3^+$ particles having a mobile constant of $4.18*10^3$ $cm^2/Vs$ are utilized in an ion implantation, and the electromagnetic wave comprises infrared rays with a frequency of 2700 $cm^{-1}$, a velocity of the electromagnetic wave equals the velocity of light, and the acceleration distance is 10 cm. If the frequency shift (Δv) is measured at 0.037 $cm^{-1}$, the real acceleration voltage is 1000V. Thus, the ion implantation energy can be calibrated according to the obtained real accelerating energy.

In the ion implantation system 100, if the type of charged particles is not changed, the frequency and velocity of the electromagnetic wave, the mobile constant of the charged particles, and the acceleration distance remain constant. Thus, after the ion implantation device is calibrated precisely once, experimental data can be used to build up a database comprising a correct relationship among frequency shift, velocity of the charged particle, and accelerating voltage. In an embodiment, by utilizing the destructive examination, the database can further comprise a relationship among implant depth, frequency shift, velocity of the charged particle, and accelerating voltage.

In other words, before the ion implantation process, the real velocity of the charged particles and the real acceleration voltage can be obtained by measuring the frequency shift. The ion implantation device 200 can be calibrated according to the obtained result to reduce inaccuracy of the ion implantation energy of the ion implantation process and improve the precision of the implant depth of the ion implantation process.

In comparison with the conventional ion implantation system and monitoring method, the invention provides non-intrusive monitoring of implant depth on a wafer. Since the real acceleration can be obtained in a relatively short time, a quick and precise ion implantation calibration can be made, leading to improved accuracy in controlling the implant depth. In addition, the invention further comprises real-time monitoring to precisely control the ion implant energy and the implant depth of ion implantation process to improve reliability of subsequent processes or applications.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An ion implantation system, comprising:
   an ion implantation device generating a plurality of charged particles and accelerating the charged particles with a accelerating voltage, generating implant energy necessary for ion implantation; and
   a monitor system performing spectroscopy analysis to obtain a velocity profile of the charged particles;
   wherein the monitor device calibrates the implantation energy of the ion implantation device according to the velocity profile of the charged particles.

2. The ion implantation system as claimed in claim 1 wherein the monitor device comprises a database, comprising a correct relationship between the velocity profile of the charged particles and the accelerating voltage for calibrating the implant energy of the ion implantation device according to the velocity profile of the charged particles.

3. The ion implantation system as claimed in claim 1 wherein the monitoring device generates an electromagnetic wave to the charged particles, the electromagnetic wave having a frequency shift after generation, the monitor device obtaining the velocity profile of the charged particles by measuring the frequency shift.

4. The ion implantation system as claimed in claim 1 wherein the electromagnetic wave comprises infrared rays.

5. The ion implantation system as claimed in claim 1 wherein the ion implantation device generates an plasma environment for ion immersion ion implantation.

* * * * *